United States Patent [19]

Hall

[11] 4,227,942

[45] Oct. 14, 1980

[54] PHOTOVOLTAIC SEMICONDUCTOR DEVICES AND METHODS OF MAKING SAME

[75] Inventor: Robert N. Hall, Schenectady, N.Y.

[73] Assignee: General Electric Company, Schenectady, N.Y.

[21] Appl. No.: 32,117

[22] Filed: Apr. 23, 1979

[51] Int. Cl.³ .......................................... H01L 31/06
[52] U.S. Cl. ................................. 136/255; 29/572; 136/256; 156/647; 156/657; 156/662; 148/179; 148/187; 357/30; 357/55; 357/68
[58] Field of Search .................. 136/89 CC, 89 SJ; 357/30, 55, 68; 29/572; 156/647, 657, 662; 148/179, 187

[56] References Cited

U.S. PATENT DOCUMENTS

| | | | |
|---|---|---|---|
| 3,020,412 | 2/1962 | Byczkowski | 250/211 |
| 3,150,999 | 9/1964 | Rudenberg et al. | 136/89 |
| 3,682,708 | 8/1972 | Bennett | 136/89 |
| 3,813,585 | 5/1974 | Tarui et al. | 357/41 |
| 4,046,594 | 9/1977 | Tarui et al. | 136/89 SJ |
| 4,133,698 | 1/1979 | Chiang et al. | 136/89 SJ |
| 4,135,950 | 1/1979 | Rittner | 136/89 SJ |

OTHER PUBLICATIONS

E. Bassous, "Fabrication Process for Precise Control of Nozzle Dimensions", *IBM Tech. Disc. Bull*, vol. 20, pp. 2474-2479, (1977).

J. J. Loferski et al., "An Experimental Investigation Into the Feasibility of Higher Efficiency Silicon Solar Cells", *Conf. Record, 9th IEEE Photovoltaic Specialists Conf.*, (1972), pp. 19-26.

*Primary Examiner*—Aaron Weisstuch
*Attorney, Agent, or Firm*—Julius J. Zaskalicky; James C. Davis, Jr.; Marvin Snyder

[57] ABSTRACT

A solar cell which has high efficiency and which can be fabricated at low cost is described. The cell includes a semiconductor wafer with a front radiation-receiving surface which is entirely open and free of current conducting grids and also includes an array of interconnection paths which carry photocurrent from the front surface through the cell to metal electrodes on the rear surface of the cell.

19 Claims, 10 Drawing Figures

Fig. 4.
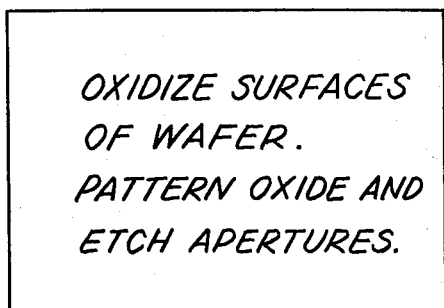
OXIDIZE SURFACES OF WAFER. PATTERN OXIDE AND ETCH APERTURES.
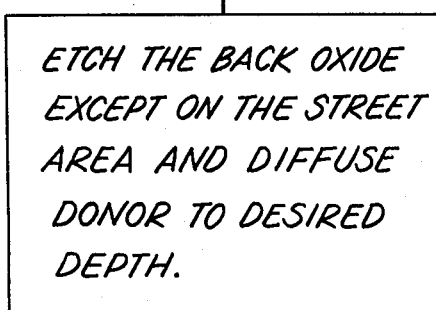
ETCH THE BACK OXIDE EXCEPT ON THE STREET AREA AND DIFFUSE DONOR TO DESIRED DEPTH.
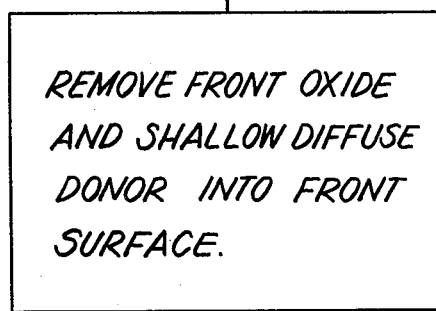
REMOVE FRONT OXIDE AND SHALLOW DIFFUSE DONOR INTO FRONT SURFACE.
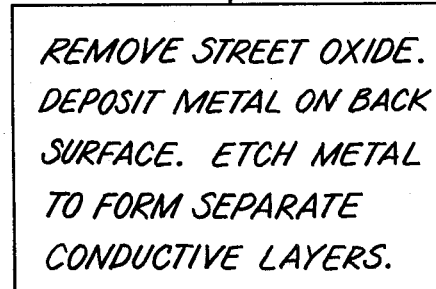
REMOVE STREET OXIDE. DEPOSIT METAL ON BACK SURFACE. ETCH METAL TO FORM SEPARATE CONDUCTIVE LAYERS.
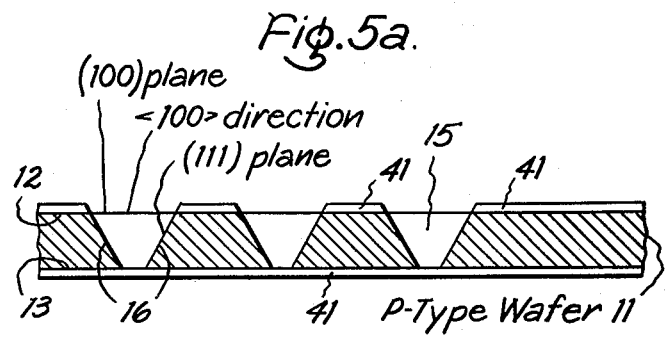
Fig. 5a.
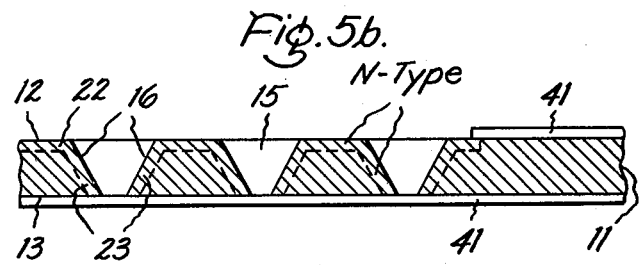
Fig. 5b.
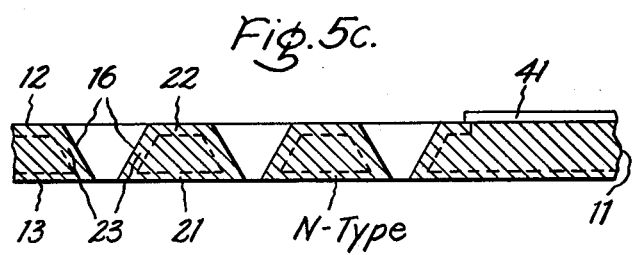
Fig. 5c.
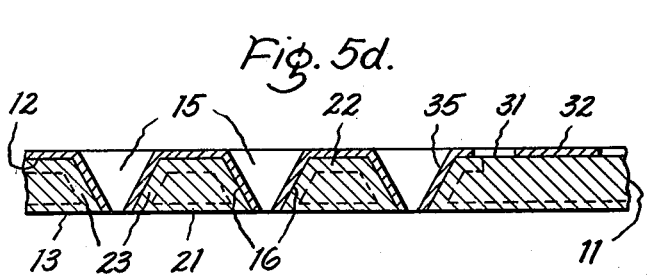
Fig. 5d.

OXIDIZE SURFACES OF WAFER. PATTERN OXIDE AND ETCH APERTURES.

ETCH THE BACK OXIDE EXCEPT ON THE STREET AREA AND DIFFUSE DONOR DEEP ENOUGH TO PENETRATE THROUGH TO FRONT SURFACE.

REMOVE FRONT OXIDE AND SHALLOW DIFFUSE DONOR INTO FRONT SURFACE

REMOVE STREET OXIDE. DEPOSIT METAL ON BACK SURFACE. ETCH METAL TO FORM SEPARATE CONDUCTIVE LAYERS.

PHOTOVOLTAIC SEMICONDUCTOR DEVICES AND METHODS OF MAKING SAME

The present invention relates to photovoltaic semiconductor devices commonly referred to as solar cells and methods of making same.

An object of the present invention is to provide a photovoltaic semiconductor device having improved efficiency of conversion of optical radiation into electrical energy.

Another object of the present invention is to provide a relatively simple solar cell structure of planar form.

A further object of the present invention is to provide a relatively simple and low-cost method of fabricating photovoltaic semiconductor devices.

In carrying out the invention in one illustrative embodiment thereof there is provided a body of cubic symmetry monocrystalline semiconductor material of one conductivity type having a pair of opposite parallel major surfaces, each parallel to a (100) crystallographic plane of the body. A plurality of recesses are provided in the body, each extending from one of the major surfaces a uniform distance into the body. The sides of each of the recesses are in the form of quadrangular pyramids with the bases of the pyramids coplanar with the one major surface. Each of the sides of the recesses is parallel to a (111) plane of the body. A first thin region of opposite conductivity type is provided in the body adjacent the other major surface of the body. A second thin region of opposite conductivity type is provided in the body adjacent the one major surface of the body. A plurality of third thin regions of opposite conductivity type are provided in the body, each adjacent the sides of a respective one of the recesses. Each of the third thin regions contact the first and second thin regions. A first conductive layer is provided connected to the second and third thin regions of opposite conductivity type. A second conductive layer is provided connected to the one type conductivity region of the body over a portion of the one major surface thereof.

The novel features which are believed to be characteristic of the present invention are set forth with particularity in the appended claims. The invention itself, both as to its organization and method of operation, together with further objects and advantages thereof, may best be understood by reference to the following description taken in connection with the accompanying drawings wherein:

FIG. 4 is a flow diagram of a method of fabricating the device of FIGS. 1–3 in accordance with the present invention.

FIGS. 5a–5d are schematic illustrations of vertical cross-sections of a body of monocrystalline silicon semiconductor material in the process of fabrication of the semiconductor device in accordance with the method of the flow diagram of FIG. 4.

Figure 1:
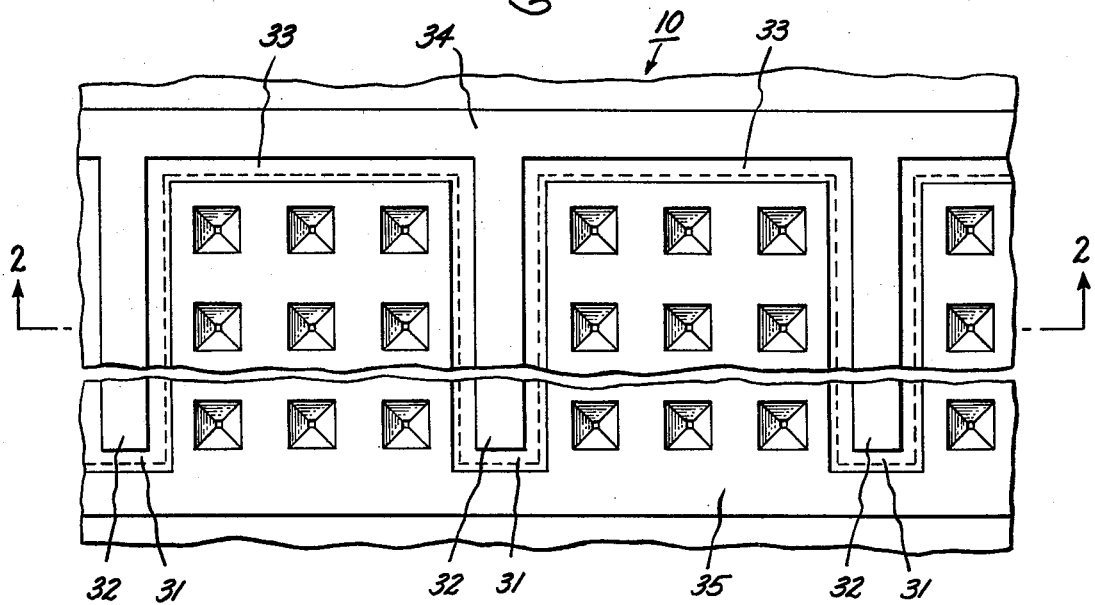
FIG. 1 is a plan view of a photovoltaic semiconductor device in accordance with one embodiment of the present invention showing the rear or electrode interconnection surface thereof.
Figure 2:
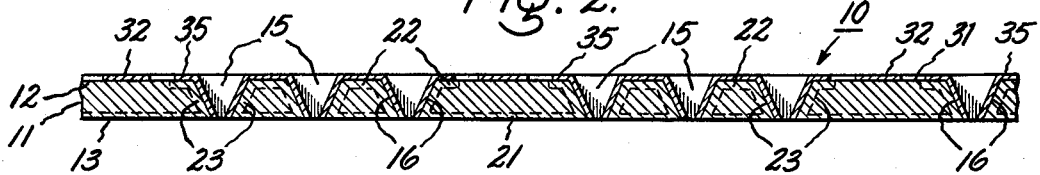
FIG. 2 is a sectional view of the device of FIG. 1 taken along section lines 2—2 showing the internal structure thereof.
Figure 3:
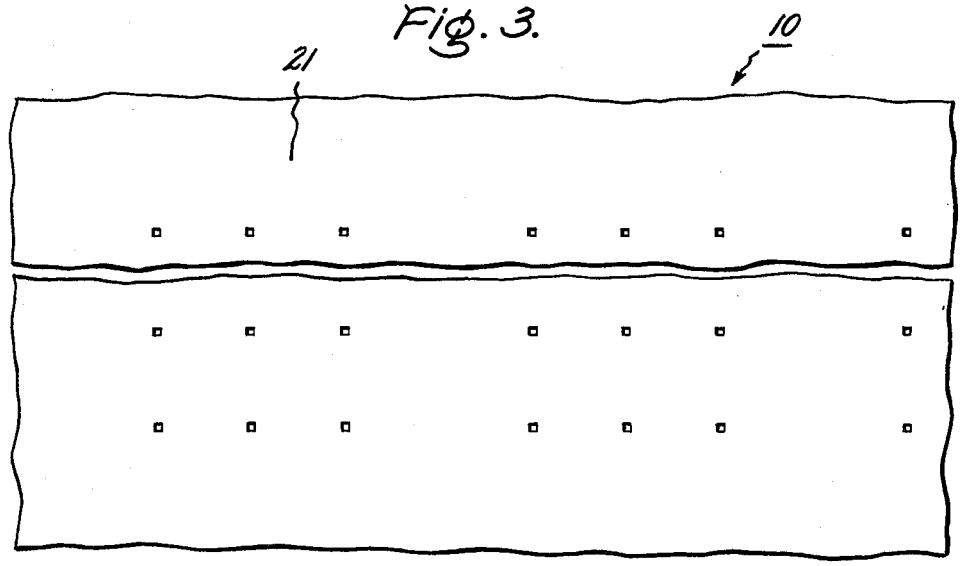
FIG. 3 is a bottom plan view of the device of FIG. 1 showing the front or radiation-receiving surface thereof.

Referring now to FIGS. 1, 2 and 3 there is shown a photovoltaic semiconductor device 10 embodying the present invention. The device includes a body 11 or wafer of monocrystalline silicon semiconductor material of P-type conductivity, for example, 0.3 ohm-cm. The body 11 includes a pair of opposite parallel major surfaces 12 and 13, each parallel to a (100) crystallographic plane of the body. A plurality of recesses or apertures 15 are provided in the body 11 each extending from the major surface 12 through to the opposite major surface 13. Each of the recesses has four sides 16 of identical outline constituting the sides of a truncated quadrangular pyramid. The base of the pyramid is coplanar with the major surface 12 and the truncated surface of the pyramid is coplanar with the surface 13. Thus, each of the apertures 15 has a large opening in the plane of the major surface 12 and a small opening in the plane of the surface 13. A first thin region 21 of N-type conductivity is formed adjacent the major surface 13 of the body. A second thin region 22 of N-type conductivity is formed in the body adjacent the major surface 12. A plurality of third thin regions 23 of N-type conductivity are formed, each adjacent the sides 16 of the apertures 15. Each of the third thin regions 23 contact both the first thin region 21 and the second thin region 22.

The body 11 of P-type silicon semiconductor material may be doped with boron and have a concentration of activator atoms of about $10^{17}$ atoms per cubic centimeter, providing a resistivity of about 0.3 ohm-cm. The first, second and third thin regions 21, 22 and 23, respectively, of N-type conductivity may have a net activator concentration at the surface regions thereof of about $10^{20}$ atoms of phosphorous per cubic centimeter, providing a resistivity of about 0.001 ohm-cm. The thickness of the first thin region 13 is preferably less than a micron to enable a substantial portion of incident radiation to penetrate beyond the PN-junction formed adjacent the major face 13 and be absorbed in the body 11. The series resistance of the device 10 is dependent on the resistivity of the first thin region 13 and its thickness, and upon the size of the truncated ends of the pyramids and their separation. To lower the series resistance it is desirable to decrease the resistivity and increase the thickness of this thin region. However, such steps increase the absorption of radiation therein and also reduce the lifetime of minority carriers therein and thus result in reducing the efficiency of conversion of incident radiation into electrical output. The resistivity of the first thin region 13 is selected with attention to these considerations in accord with well-established solar cell technology. The second and third thin regions of N-type conductivity preferably are substantially thicker, for example, of the order of 2 to 10 microns to provide low resistance and sufficient depth to enable metallic films or layers to be bonded thereto without destroying the integrity of the PN-junctions they form with the body 11 of P-type conductivity.

The apertures 15 are shown organized in a regular pattern consisting of sets or groups of apertures. In the plane 12 the apertures appear as squares. Each group of squares consists of three columns and a plurality of rows. The squares in a row are shown equally spaced and also the squares in a column are shown equally spaced. In this example, the spacing between squares in a row and also the spacing between squares in a column is shown equal to the dimension of a side of a square although such equality is not essential. Adjacent columns of successive sets or groups of squares are spaced apart by a distance equal to three times the dimension of a side of a square. An area 31 of the major surface 12 extending in the column direction does not include the second thin region 22 of N-type conductivity and is referred to as a street area. Also an area 33 of the major surface strip extending in the row direction spaced above the first row of squares does not include the second thin region of N-type conductivity and is referred to as an avenue area. These street and avenue areas are of P-type conductivity and enable ohmic or low impedance connections to be made to the body 11 to constitute one of the current carrying electrodes of the device. As shown in FIGS. 1 and 2, conductive fingers 32 extending in the column direction are bonded to the street areas 31. The conductive fingers 32 are joined in the conductive bus 34 bonded to the avenue area 33 of the surface 12 to constitute the second electrode of the device. The first electrode 35 of the device is provided by a conductive layer 35 bonded to the second and third regions of N-type conductivity type. The conductive layer 35 is constituted of wide fingered conductors extending in the column direction and each overlying a respective set or group of apertures and bonded thereto. The wide fingered conductors are interconnected at the side thereof remote from the conductive bus 34.

Preferably, the body 11 of semiconductor material is not so thin that it would be difficult to handle in the fabrication thereof and on the other hand should not be so thick that carriers generated by incident radiation would recombine in the body before being collected by an adjacent PN-junction. Conveniently, the body may be 10 mils thick. In accord with the selective etching method herein described for forming apertures 15, with such a starting dimension each of the square openings of the body of the aperture would be about 15 mils to provide the structure shown in FIGS. 1, 2 and 3. The side of a square opening is made slightly greater than the thickness of the body multiplied by $\sqrt{2}$.

Reference is now made to FIGS. 4 and 5a-5d, which illustrate a manner of fabrication of the devices of FIGS. 1-3 in accordance with another aspect of the present invention to provide a solar cell constituted of a body of P-type conductivity. A piece of monocrystalline silicon is cut from an ingot of P-type conductivity to provide a wafer 11 having a pair of opposite parallel major surfaces, each parallel to a (100) crystallographic plane of the wafer. The ingot of P-type conductivity has been doped with a suitable doping agent, such as boron, to provide a suitable resistivity to the wafer, for example, 0.3 ohm-cm. The major surfaces of the wafer are etched to provide a wafer about 10 mils thick with a pair of smooth planar surfaces 12 and 13. After standard cleaning, the wafer is oxidized in steam for a time and temperature to provide a thin layer of silicon dioxide 41 about 1 micron thick on each of the major surfaces 12 and 13 of the wafer. The silicon dioxide layer 41 overlying the back or rear side 12 of the wafer is patterned using conventional photoresist masking and etching techniques to provide a pattern of square openings therein exposing the major surface 12. The square openings are arranged into groups, each group having three columns and a plurality of rows. The squares in a row are spaced from an adjacent square by a distance equal to a side of the square and similarly the squares in a column are spaced from an adjacent square by the distance of a side of the square. Both the column axis and the row axis of squares are aligned parallel to a <110> crystallographic direction of the wafer in the surface 12. Each group of square openings is separated in the row direction from an adjacent group of square openings by wide areas of silicon dioxide without openings and overlying the portion of the major surface 12, referred to as the street area. For a wafer 10 mils in thickness the sides of the square openings are made 15 mils wide so that when the silicon exposed by the square openings is anisotropically etched, as will be described below, an aperture of pyramidal outline extending to the opposite major surface 13 will be formed in which the sides of the aperture are parallel to (111) planes of the wafer which are oriented at 54.7 degrees with respect to the surface 12. After cleaning, the wafer is immersed in a suitable anisotropic etchant, such as an etchant consisting of approximately 3 parts by volume of a solution of 45% potassium hydroxide and 1 part by volume of isopropyl alcohol, for a sufficient period of time to cause etching action to occur into the portions of the wafer exposed by the square openings. Ultrasonic agitation of the etchant facilitates the etching action. The apertures 15 formed by the etching action extend to the opposite surface 13. The apertures are in the form of quadrangular pyramids the bases of which are squares in the surface 12 as shown in FIG. 5a, and also in FIGS. 1, 2 and 3. Next, the silicon dioxide layer 41 overlying the street areas 31 and avenue areas 32 and also the silicon dioxide layer overlying the front surface 13 of the wafer are covered with a protecting wax.

The wafer is then etched in a buffered hydrofluoric acid etchant to remove the portion of silicon dioxide layer 41 on the back or rear surface 12 not covered with wax. After cleaning, a donor such as phosphorous is diffused into the exposed surfaces 12 and 16 of the wafer to form the second thin region 22 and the third thin regions 23 in the wafer about 2 to 10 microns thick and of relatively low resistivity, as shown in FIG. 5b. This step may be an open tube diffusion step in which a phosphosilicate glass is deposited on the exposed surface of wafer and thereafter diffused at a temperature for a sufficient time to provide the desired depth and resistivity for the second and third thin regions.

While protecting the silicon dioxide layer 41 overlying the street and avenue areas 31 and 33 by covering these areas with wax, the silicon dioxide layer on the front surface 13 is removed in a suitable etchant such as buffered hydrofluoric acid. Thereafter, the wafer 11 is subjected to a diffusion step in which phosphorous is diffused into the front surface 13 to a shallow depth to provide the first thin region 21 of the device of FIGS. 1, 2 and 3, for example, less than 1 micron thick and of low resistivity. The open tube diffusion process mentioned above could also be utilized to provide this first thin region 21. The time and temperature utilized is such as to provide the desired depth and resistivity for this first thin region 21. In the next step, the silicon dioxide layer overlying the street and avenue areas of the wafer and the phospho-silicate glass overlying the remaining portions of the rear surface 12, the sides 16 of the apertures 15 and the front surface 13 are removed by etching in a suitable etch such as buffered hydrofluoric acid, and the wafer is cleaned. Thereafter, the rear surface 12 and also the surfaces 16 of the apertures 15 are metallized with a metal such as aluminum to a suitable thickness, for example, 2 microns. The aluminum layer is then selectively etched using photoresist masking and etching techniques well-known in the art to provide a first conductive layer 35 making contact to the second thin region 22 of N-type conductivity adjacent the major surface 12 and to the third thin region 23 of N-type conductivity adjacent the sides of the apertures and a second conductive layer 32 and 34 overlying the street and avenue areas and making contact to the P-type wafer 11 of semiconductor material in the rear surface thereof.

Figure 6:
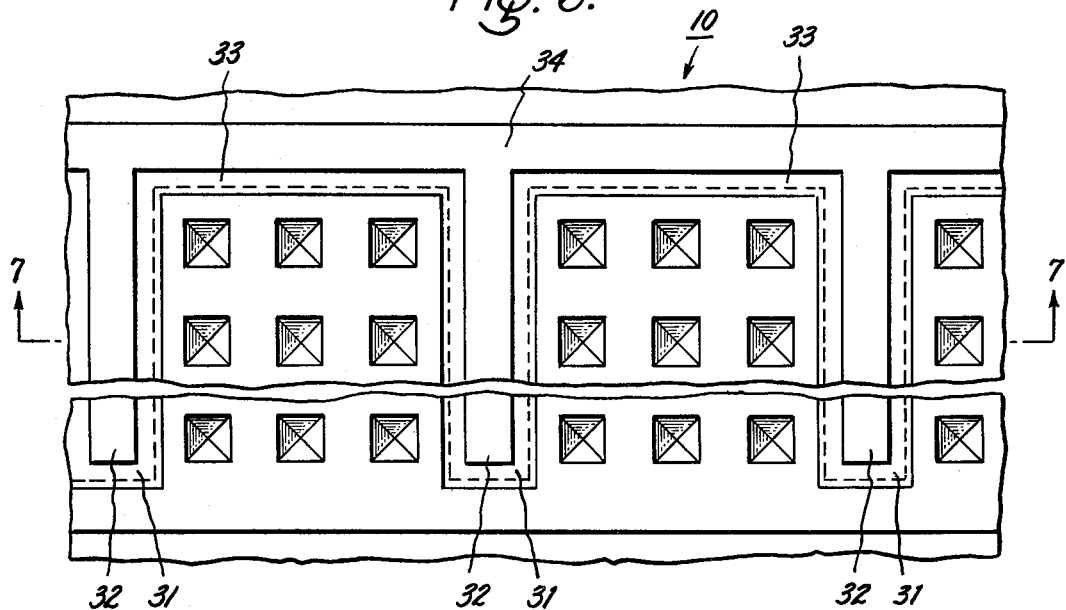
FIG. 6 is a top plan view of a photovoltaic semiconductor device in accordance with another embodiment of the present invention showing the rear or electrode interconnection surface thereof.
Figure 7:
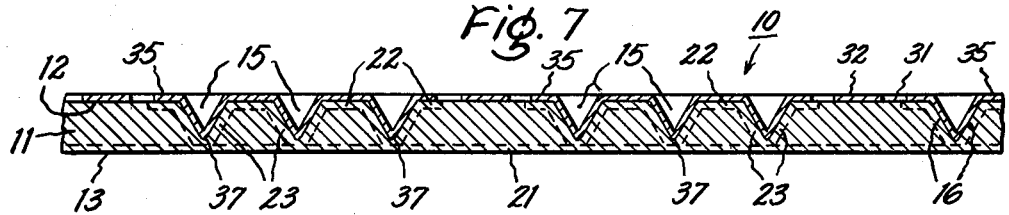
FIG. 7 is a sectional view of the device of FIG. 6 taken along section lines 7—7 thereof showing the internal structure thereof.
Figure 8:
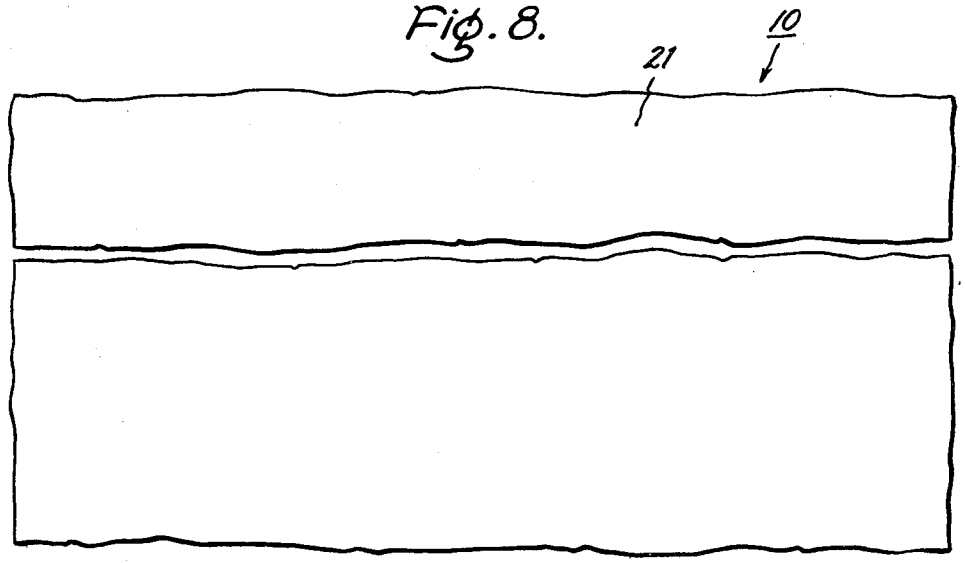
FIG. 8 is a bottom plan view of the device of FIG. 6 showing the front or radiation-receiving surface thereof.
Figure 9:
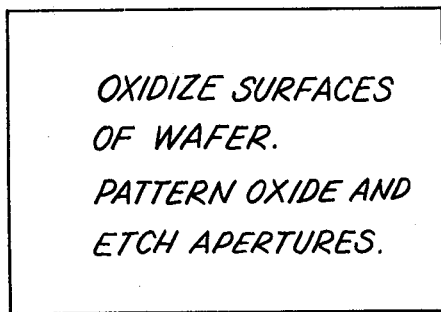
FIG. 9 is a flow diagram of a method of fabricating the device of FIGS. 6–8 in accordance with the present invention.
Figure 9:
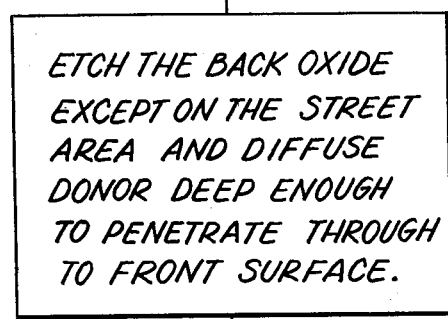
Figure 9:
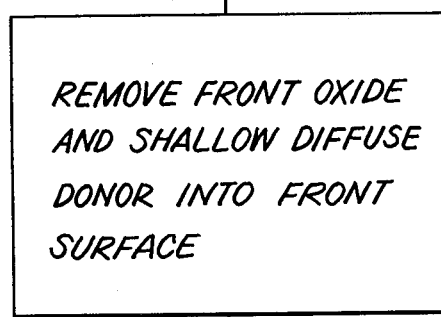
Figure 9:
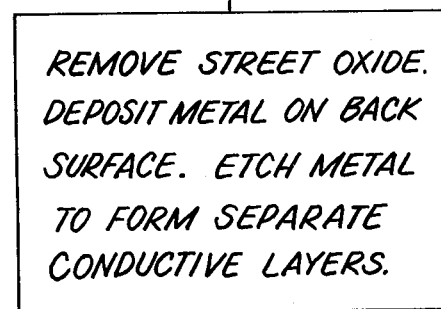
Figure 10A:
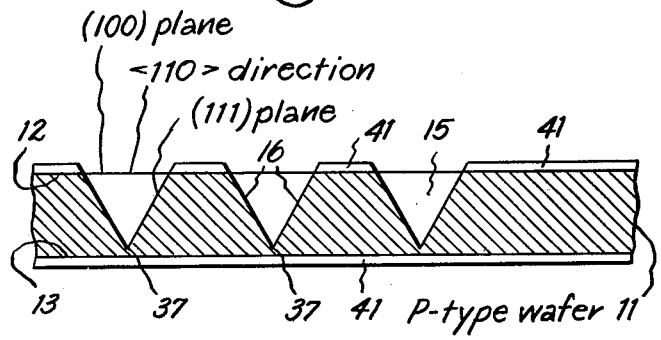
FIGS. 10a–10d are schematic illustrations of vertical cross-sections of a body of monocrystalline silicon semiconductor material in the process of fabrication of the semiconductor device in accordance with the method of the flow diagram of FIG. 9.
Figure 10B:
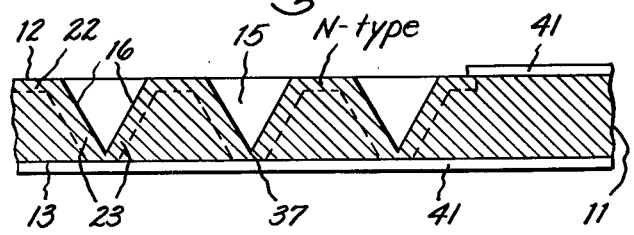
Figure 10C:
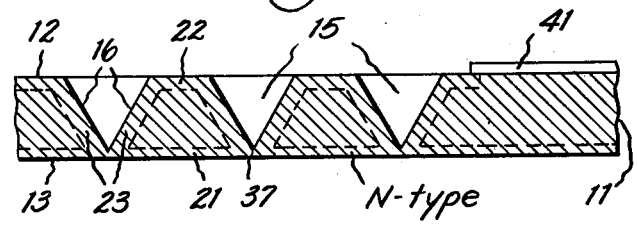
Figure 10D:
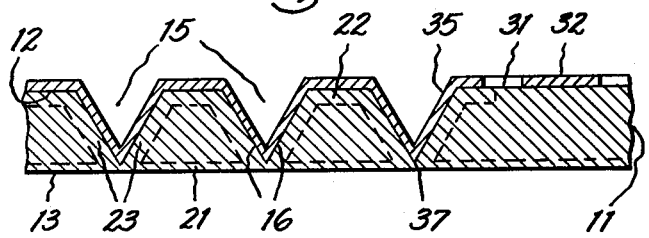

Reference is now made to FIGS. 6, 7 and 8 illustrating another embodiment in accordance with the present invention similar to the embodiment of FIGS. 1, 2 and 3. The elements of the device of FIGS. 6, 7 and 8 identical to the device of FIGS. 1, 2 and 3 are identically designated. The essential difference in the device of this figure is that the recesses 15 stop at a point 37 a short distance from the front surface 13. This distance is less than the thickness of the third thin regions 23 of opposite conductivity type adjacent the sides 16 of the recesses so that the third thin regions 23 connect with the first thin region 21. This result is obtained, as will be pointed out in connection with FIGS. 8, 9 and 10, by setting the dimension of a side of the square openings equal to slightly less than the thickness of the body multiplied by $\sqrt{2}$.

Reference is now made to FIGS. 9 and 10a–10d which illustrate a manner of fabrication of the device of FIGS. 6–8 in accordance with another aspect of the present invention. The method illustrated in connection with FIGS. 9 and 10a–10d is similar to the method illustrated in connection with FIGS. 4 and 5a–5d except that third thin regions 23 are made thicker and the sides of the square openings are made equal to less than the thickness of the wafer multiplied by $\sqrt{2}$ so that the recesses 15 depicted in FIG. 10a extend into the wafer to points 37 a short distance from the front face 13. The predetermined distance between the apex 37 of the recess and the front surface 13 is made less than the thickness of the third thin region 23 of opposite conductivity type so that in the process of formation of the various first, second and third thin regions in the wafer, the third thin region contacts the first thin layer and provides a low resistance connection thereto. If it is assumed that the third thin regions 23 are 40 microns thick, the distance between point 37 and the front surface 13 could be set equal to about 20 microns. Apertures extending to within 20 microns of the front surface 12 would be obtained by starting with square openings having sides equal to the thickness of the wafer less 20 microns multiplied by $\sqrt{2}$. For a 10 mil wafer, the sides of the squares would be 13 mils. The anisotropic etching of the wafer would stop when the point 37 is reached representing the intersecting of the (111) planes of the wafer.

The photovoltaic devices of the present invention have a number of features which provide increased efficiency over conventional photovoltaic devices. The front or radiation-receiving surface is free of any metal grid thereby eliminating shadowing losses. The absence of grid metallization on the front surface eliminates the degradation of the thin front-surface PN-junction caused by the overlying metal in conventional devices. The PN-junction adjacent the rear surface of applicant's device is made deeper to avoid this problem. Series resistance is substantially reduced. The spreading resistance in the first thin region 21 of FIGS. 1–3, adjacent the front surface around the small holes therein is much less than that of an array of parallel line contacts of equal area, and the ohmic drop along such lines themselves is eliminated. Also, metallization layers on the second thin region 22 and third thin region 23 provide a low impedance path to the first thin region 21 as well as the second thin region 23 and the third thin region 23. Also, current is collected at both the front and rear surfaces of the devices thereby reducing carrier recombination losses therein. The (100) crystallographic orientation that is required for the formation of the pyramidal recesses also permits the creation of a textured front surface which reduces reflection loss. Also, anti-reflection layers may be applied to the front surface to further reduce reflection losses. The performance of the device is independent of the area or diameter of the semiconductor body utilized in the device. As the device has a planar front, it is also easier to assemble in modules.

In accordance with the present invention a relatively simple and low-cost method of fabricating solar cells is also provided. Only one photoresist operation, which does not involve registration with a previous pattern, is required. No high-definition metallization is used. All patterning is on the rear surface of the semiconductor wafer so there is no conflict with having a textured front surface.

While in the devices described in connection with FIGS. 1–3 and FIGS. 6–8, the apertures 15 have square openings in the plane of major surface 12, rectangular openings could have been utilized, if desired, to provide pyramidal apertures with rectangular bases. Also, while the square openings were produced with etch masks having square openings, they could as well have been produced with etch masks with circular openings. In the latter case anisotropic etching would cause etching to occur with respect to each circular opening over a surface region bounded by square openings having sides parallel to <110> directions in which the circular opening is inscribed. The resultant aperture would be a quadrangular pyramid with each of the sides thereof parallel to a (111) plane of the semiconductor material.

While in the fabrication of the devices shown in FIGS. 1–3 and FIGS. 6–8, the second thin region 22 and the third thin region 23 were formed first by a first diffusion step and thereafter the first thin region 21 adjacent the front surface 13 was formed by a second diffusion, all of these regions may be formed at the same time by initially ion implanting more slowly diffusing donor activators such as arsenic in the silicon dioxide layer 41 overlying the front surface 13 and therefore enable the formation of the first thin region 21 while the second thin region 22 and third thin region 23 are being formed as previously formed.

While in the device of FIGS. 1, 2 and 3, and the device of FIGS. 6, 7 and 8 only several groups of apertures have been shown, as many such groups as desired may be included extending in both the row and column directions limited only by the size of the wafer on which such apertures are formed.

While each of the groups shown include a row of three apertures, the number of apertures in a row may be increased or decreased, as desired. Also the spacing between adjacent apertures in a group may be changed as desired, to increase or decrease the density of apertures in the wafer. Of course, different sizes of apertures would be used with wafers of different thicknesses. The preferred choice among the variants is determined by wafer resistivity and solar intensity.

While the invention has been illustrated in connection with devices using silicon semiconductor material, other monocrystalline semiconductor materials of cubic symmetry, such as germanium and the Group III-Group V compound semiconductor materials may be utilized in accordance with the present invention. The utilization of such materials would require alteration in the details of the steps of fabrication of devices of these semiconductor materials in accordance with their respective technologies.

While the device has been illustrated in connection with a body or wafer of semiconductor material of P-type conductivity, it will of course be understood that N-type semiconductor material may as well be used. Use of such material would of course require the first, second and third thin regions to be of P-type conductivity.

While the invention has been described in specific embodiments, it will be understood that modifications such as those described above, may be made by those skilled in the art and it is intended by the appended claims to cover all such modifications and changes as fall within the true spirit and scope of the invention.

What I claim as new and desire to secure by Letters Patent of the United States is:

1. A photovoltaic device comprising
   a body of cubic symmetry monocrystalline semiconductor material of one conductivity type having a pair of opposite parallel major surfaces, each parallel to a (100) crystallographic plane of said body,
   a plurality of recesses in said body, each in the form of a quadrangular pyramid with the base of the pyramid coplanar with one of said pair of major surfaces and extending a uniform distance into said body, each of the sides of the recesses being parallel to a (111) plane of said body of monocrystalline semiconductor material,
   a first thin region of opposite conductivity type in said body along the other of said pair of major surfaces of said body,
   a second this region of opposite conductivity type in said body along said one major surface of said body,
   a plurality of third thin regions of opposite conductivity type, each in said body along the sides of said recesses, each of said third thin regions contacting said first and second thin regions,
   a first conductive layer connected to said second and third thin regions of opposite conductivity type,
   a second conductive layer connected to said one type conductivity region of said body over a portion of said one major surface.

2. The device of claim 1 in which said monocrystalline cubic symmetry semiconductor material is selected from the class of silicon and germanium.

3. The device of claim 1 in which said monocrystalline cubic symmetry semiconductor material is silicon.

4. The device of claim 1 in which each of said recesses is an aperture extending from said one major surface to said other major surface.

5. The device of claim 1 in which each of said recesses extends from said one major surface to a point located a small predetermined distance from said other major surface.

6. The device of claim 1 in which said recesses are arranged in a regular pattern in said body.

7. The device of claim 3 in which said first thin region is less than one micron thick.

8. The device of claim 3 in which said first thin region is substantially thinner than said second and third thin regions.

9. The device of claim 3 in which said portion of said one major surface includes areas spaced at intervals therealong, said second conductive layer being bonded on said areas.

10. A method of making a photovoltaic device comprising
   providing a substrate of cubic symmetry monocrystalline semiconductor material of one conductivity type having a pair of parallel major surfaces, each parallel to a (100) crystallographic plane of said monocrystalline semiconductor material,
   providing a first etch mask over one of said pair of major surfaces and a second etch mask over the other of said pair of major surfaces,
   forming in said first etch mask a plurality of first openings to expose areas in a first portion of said one major surface, each first opening being identical in form and being bounded by two pairs of parallel opposed edges in said one major surface, each of said pairs of edges being substantially parallel to a respective <110> direction in said one major surface, each pair of parallel edges of each first opening being spaced apart by a distance slightly greater than the distance between said major surfaces multiplied by $\sqrt{2}$,
   etching the exposed areas of said substrate with an anisotropic etchant to form a plurality of apertures each in the form of a quadrangular pyramid with the base of the pyramid being coplanar with said one major surface and extending from said one major surface to said other major surface to form a second opening therein substantially smaller than a respective one of said first openings, each of the sides of said apertures being parallel to a (111) plane of said monocrystalline semiconductor material.
   removing said first etch mask at least from said first portion of said one major surface,
   introducing a first dopant of opposite conductivity type into said other major surface to form a first thin region of opposite conductivity type in said substrate along said other major surface,
   introducing a second dopant of opposite conductivity type into said first portion of said major surface to form a second thin region of opposite conductivity type in said substrate along said first portion of said one major surface;
   introducing a third dopant of opposite conductivity type into the sides of said apertures to form third thin regions of opposite conductivity type in said substrate along the sides of said apertures, stripping said one major surface, and said other major surface of overlying layers of masking material, depositing a layer of conductive material on said one major surface and the sides of said apertures, patterning said conductive layer to provide a first electrode contacting said regions of opposite conductivity type adjacent said first portion of said one major surface and the sides of said apertures and a second electrode contacting said substrate of one conductivity type at another portion of said one major surface.

11. The method of claim 10 in which said first, second and third dopants are introduced into said substrate by diffusion.

12. The method of claim 10 in which said first dopant, said second dopant, and said third dopant are introduced simultaneously into said substrate to form simultaneously said first thin region, said second thin region and said third thin regions.

13. The method of claim 10 in which said second and third dopants are introduced into said substrate to form said second and third thin regions and thereafter said first dopant is introduced into said substrate to form said first thin regions.

14. The method of claim 10 in which each of said first openings are squares.

15. A method of making a photovoltaic device comprising providing a substrate of cubic symmetry monocrystalline semiconductor material of one conductivity type having a pair of parallel major surfaces, each parallel to a (100) cyrstallographic plane of said monocrystalline semiconductor material, providing a first etch mask over one of said pair of surfaces and a second etch mask over the other of said pair of major surfaces, forming in said first etch mask a plurality of openings to expose areas in a first portion of said one major surface, each opening being identical in form and being bounded by two pairs of parallel opposed edges in said one major surface, each of said pairs of edges being substantially parallel to a respective <110> direction in said one major surface, each pair of parallel edges of each opening being spaced apart by a distance slightly less than the distance between said major surfaces multiplied by $\sqrt{2}$, etching the exposed areas of said substrate with an anisotropic etchant to etch a plurality of recesses each in the form of a quadrangular pyramid with the base of the pyramid being coplanar with said one major surface and the apex thereof being located a small predetermined distance from said other major surface, each of the sides of said apertures being parallel to a (111) plane of said monocrystalline semiconductor material, removing said first etch mask at least from said first portion of said one major surface, introducing a first dopant of opposite conductivity type into said other major surface to form a first thin region of opposite conductivity type in said substrate along said other major surface, introducing a second dopant of opposite conductivity type into said first portion of said one major surface to form a second thin region of opposite conductivity type in said substrate along said first portion of said one major surface, introducing a third dopant of opposite conductivity type into the sides of said recesses to form third thin regions of opposite conductivity type in said substrate along the sides of said recesses, the thickness of said third thin region being greater than said small predetermined distance, stripping said one major surface and said other major surface of overlying layers of masking material, depositing a layer of conductive material on said one major surface and the sides of said recesses, patterning said conductive layer to provide a first electrode contacting said regions of opposite conductivity type adjacent said first portion of said one major surface and the sides of said recesses and a second electrode contacting said substrate of one conductivity type at another portion of said one major surface.

16. The method of claim 15 in which said first, second and third dopants are introduced into said substrate by diffusion.

17. The method of claim 15 in which said first dopant, said second dopant, and said third dopant are introduced simultaneously into said substrate to form simultaneously said first thin region, said second thin region and said third thin regions.

18. The method of claim 15 in which said second and third dopants are introduced into said substrate to form said second and third thin regions and thereafter said first dopant is introduced into said substrate to form said first thin regions.

19. The method of claim 15 in which each of said openings are squares.

* * * * *